(12) United States Patent
Hu (10) Patent No.: US 10,477,633 B1
(45) Date of Patent: Nov. 12, 2019

(54) DEVICE FOR DRIVING LIGHT-EMITTING DIODES (LEDS)

(71) Applicant: MEAN WELL (GUANGZHOU) ELECTRONICS CO., LTD., Tianhe District (CN)

(72) Inventor: Min-Qiang Hu, Tianhe District (CN)

(73) Assignee: Mean Well (Guangzhou) Electronics Co., Ltd., Guangzhou (CN)

( * ) Notice: Subject to any disclaimer, the term of this patent is extended or adjusted under 35 U.S.C. 154(b) by 0 days.

(21) Appl. No.: 16/265,229

(22) Filed: Feb. 1, 2019

(30) Foreign Application Priority Data

Dec. 18, 2018 (TW) .............................. 107145698 A (51) Int. Cl.
*H05B 33/08* (2006.01)
*H05K 1/18* (2006.01)
*H05K 1/14* (2006.01)

(52) U.S. Cl.
CPC ..... *H05B 33/0821* (2013.01); *H05B 33/0851* (2013.01); *H05K 1/144* (2013.01); *H05K 1/181* (2013.01); *H05K 2201/042* (2013.01); *H05K 2201/10325* (2013.01); *H05K 2201/10522* (2013.01)

(58) Field of Classification Search
None
See application file for complete search history.

(56) References Cited

U.S. PATENT DOCUMENTS

2015/0249337 A1* 9/2015 Raneri .................... H02J 3/005
307/24
2017/0290120 A1* 10/2017 Peng .................. H05B 33/0821

FOREIGN PATENT DOCUMENTS

CN 1874640 A 12/2006
TW 200845643 A 11/2008

* cited by examiner

*Primary Examiner* — Jany Richardson
(74) *Attorney, Agent, or Firm* — Rosenberg, Klein & Lee (57) ABSTRACT

A device for driving light-emitting diodes (LEDs) includes an address transceiver, a processor, and at least one power supply. The address transceiver stores a communication address and receives a Konnex (KNX) protocol signal carrying a driving address. The address transceiver generates a driving signal when the driving address corresponds to the communication address. The processor, electrically connected to the address transceiver, receives the driving signal and generates a power starting signal according to the driving signal. The power supply, electrically connected to the processor and at least one light-emitting diode (LED) module, receives the power starting signal and uses the power starting signal to drive the LED module.

15 Claims, 6 Drawing Sheets

DEVICE FOR DRIVING LIGHT-EMITTING DIODES (LEDS)

This application claims priority for Taiwan patent application no. 107145698 filed on Dec. 18, 2018, the content of which is incorporated by reference in its entirely.

BACKGROUND OF THE INVENTION

Field of the Invention

The present invention relates to a driving device, particularly to a device for driving light-emitting diodes (LEDs).

Description of the Related Art

The Konnex (KNX) protocol technical standard is a professional control technology widely used in various constructions. The KNX protocol is an only open world standard in the control field. In these applications, the KNX protocol is approved as the European standard (CENELEC EN 50090 & CEN EN 13321-1), the international standard, the American standard (ANSI/ASHRAE 135), and the China standard (GB/T 20965-2013), which proves that the KNX protocol will be an important subject in the future.

The KNX protocol was promoted by the user organization committee in China. Using a touch panel, the KNX protocol remotely controls all electronic equipment in constructions, such as offices and apartments. The electronic equipment includes illumination systems, shading systems, blinds, security systems, energy management, heating systems, ventilation systems, air conditioning systems, signal and monitoring systems, service interfaces and building control systems, remote control, metering, video/audio control, and large appliances. The KNX protocol system presets requirement for surroundings, cooperates with various environmental detectors to detect the present situations, and automatically turns on the air conditioner or adjusts the brightness of illuminators without manual control, so as to satisfy the preset requirement. The KNX protocol system not only makes people feel comfortable and safe, but also controls the state of space to greatly save power and achieve weather protection. Presently, illuminators are mainly realized with LEDs. In the market, the driver used for coaxing color has the KNX specification for low input voltage or for AC input voltage and constant output voltage. The application of LED illumination mostly operates in an AC input and constant output mode. At present, there is no LED driver that operates in an AC input and constant output mode and complies with the KNX specification To overcome the abovementioned problems, the present invention provides a device for driving light-emitting diodes (LEDs), so as to solve the afore-mentioned problems of the prior art.

SUMMARY OF THE INVENTION

The primary objective of the present invention is to provide a device for driving light-emitting diodes (LEDs), which directly uses a KNX protocol signal to drive a LED module rather than converts the KNX protocol signal into another protocol, such as a digital addressable lighting interface (DALI) protocol, to drive the LED module, thereby reducing the cost of controlling and managing illuminators.

To achieve the abovementioned objectives, the present invention provides a device for driving light-emitting diodes (LEDs), which comprises an address transceiver, a processor, and at least one power supply. The address transceiver stores a communication address and receiving a Konnex (KNX) protocol signal carrying a driving address, and the address transceiver generates a driving signal when the driving address corresponds to the communication address. The processor, electrically connected to the address transceiver, receives the driving signal and generates a power starting signal according to the driving signal. The power supply, electrically connected to the processor and at least one light-emitting diode (LED) module, receives the power starting signal and uses the power starting signal to drive the at least one LED module.

In an embodiment of the present invention, the KNX protocol signal is generated by a main control device electrically connected to the address transceiver.

In an embodiment of the present invention, the processor triggers the address transceiver to generate a responding signal carrying the communication address and transmit the responding signal to the main control device when the processor stops generating the power starting signal.

In an embodiment of the present invention, the power starting signal is a pulse width modulation signal, the processor is electrically connected to a grounding terminal and a signal controlling terminal, the signal controlling terminal is electrically connected to the at least one power supply, and the processor receives a grounding voltage through the grounding terminal, receives a high voltage through the signal controlling terminal, and generates the power starting signal at the signal controlling terminal according to the driving signal, the grounding voltage, and the high voltage.

In an embodiment of the present invention, the processor further comprises a controller, electrically connected the address transceiver, receiving the driving signal; and an electronic switch, electrically connected between the signal controlling terminal and the grounding terminal, receiving the grounding voltage and the high voltage, a control terminal of the electronic switch is electrically connected to the controller, the controller cooperates with the high voltage and the grounding voltage to use the driving signal to control a switching state of the electronic switch, thereby generating the power starting signal at the signal controlling terminal, and the controller triggers the address transceiver to generate the responding signal when the controller stops controlling the switching state of the electronic switch.

In an embodiment of the present invention, the electronic switch is an N-channel metal oxide semiconductor field effect transistor (NMOSFET), a gate of the NMOSFET is used as the control terminal, a source of the NMOSFET is electrically connected the grounding terminal, and a drain of the NMOSFET is electrically connected to the signal controlling terminal.

In an embodiment of the present invention, the processor further comprises a first resistor electrically connected between the controller and the gate; and a second resistor electrically connected between the gate and the source.

In an embodiment of the present invention, the at least one power supply further comprises a plurality of power supplies, the at least one LED module further comprises a plurality of LED modules, and the plurality of power supplies are respectively electrically connected to the plurality of LED modules.

In an embodiment of the present invention, the at least one power supply further comprises a transformer having a primary side and a secondary side, the primary side receives a fixed voltage, and the secondary side is electrically connected to the at least one LED module; an electronic control switch electrically connected to the primary side and the grounding terminal; a pulse width modulator, electrically connected to the electronic control switch, controlling a switching state of the electronic control switch and using the fixed voltage to store energy into the primary side, and the secondary side converts the energy into an output signal; a comparison circuit, electrically connected to the secondary side and the signal controlling terminal, receiving the output signal and the power starting signal and comparing the output signal with the power starting signal to generate a comparison result; and an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

In an embodiment of the present invention, the at least one power supply further comprises a transformer having a primary side and a secondary side, the primary side receives a fixed voltage, and the secondary side is electrically connected to the at least one LED module; an electronic control switch electrically connected to the primary side and the grounding terminal; a pulse width modulator, electrically connected to the electronic control switch and the signal controlling terminal, receiving the power starting signal, controlling a switching state of the electronic control switch according to the power starting signal, and using the fixed voltage to store energy into the primary side, and the secondary side converts the energy into an output signal; a comparison circuit, electrically connected to the secondary side and a direct-current (DC) signal terminal, receiving the output signal and a DC signal of the DC signal terminal and comparing the output signal with the DC signal to generate a comparison result; and an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

In an embodiment of the present invention, the power starting signal is an analog signal, the processor is electrically connected to a grounding terminal and the at least one power supply, and the processor receives a grounding voltage through the grounding terminal and generates the power starting signal according to the driving signal and the grounding voltage.

In an embodiment of the present invention, the processor further comprises a controller, electrically connected to the address transceiver, receiving the driving signal; and a power starter, electrically connected to the controller, the grounding terminal and the at least one power supply, receiving the grounding voltage, the controller cooperates with the grounding voltage to drive the power starter to generate the power starting signal, and the controller triggers the address transceiver to generate the responding signal when the controller stops driving the power starter to generate the power starting signal.

In an embodiment of the present invention, the power starter further comprises an amplifier having a negative input, a positive input, and an output, and the output is electrically connected to the at least one power supply; a first starting resistor electrically connected between the output and the negative input; a second starting resistor electrically connected between the negative input and the grounding terminal, and the amplifier receives the grounding voltage through the second starting resistor; a starting capacitor electrically connected between the grounding terminal and the positive input; and a third starting resistor electrically connected between the positive input and the controller, the controller uses the first starting resistor, the second starting resistor, the starting capacitor, the third starting resistor, and the grounding voltage to drive the output of the amplifier to generate the power starting signal, and the controller triggers the address transceiver to generate the responding signal when the controller stops driving the amplifier to generate the power starting signal.

In an embodiment of the present invention, the at least one power supply further comprises a transformer having a primary side and a secondary side, the primary side receives a fixed voltage, and the secondary side is electrically connected to the at least one LED module; an electronic control switch electrically connected to the primary side and the grounding terminal; a pulse width modulator, electrically connected to the electronic control switch, controlling a switching state of the electronic control switch and using the fixed voltage to store energy into the primary side, and the secondary side converts the energy into an output signal; a comparison circuit, electrically connected to the secondary side and the power starter, receiving the output signal and the power starting signal and comparing the output signal with the power starting signal to generate a comparison result; and an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

In an embodiment of the present invention, the at least one power supply further comprises a transformer having a primary side and a secondary side, the primary side receives a fixed voltage, and the secondary side is electrically connected to the at least one LED module; an electronic control switch electrically connected to the primary side and the grounding terminal; a pulse width modulator, electrically connected to the electronic control switch and the power starter, receiving the power starting signal, controlling a switching state of the electronic control switch according to the power starting signal, and using the fixed voltage to store energy into the primary side, and the secondary side converts the energy into an output signal; a comparison circuit, electrically connected to the secondary side and a DC signal terminal, receiving the output signal and a DC signal of the DC signal terminal and comparing the output signal with the DC signal to generate a comparison result; and an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

In an embodiment of the present invention, the device for driving LEDs further comprises a first printed circuit board having two opposite surfaces, the address transceiver and the processor are installed on one of the two opposite surfaces, another of the two opposite surfaces is provided with a first port, and the address transceiver is electrically connected to the processor through the first printed circuit board; and a second printed circuit board provided with the at least one power supply, a Konnex (KNX) protocol port, and a second port thereon, the KNX protocol port is close to an edge of the second printed circuit board, the second port is far away from the edge of the second printed circuit board, the first port is electrically connected to the second port and electrically connected to the KNX protocol port and the address transceiver through the first printed circuit board and the second printed circuit board, the at least one power supply is electrically connected to the processor through the first printed circuit board, the second printed circuit board, the first port, and the second port, and the KNX protocol port is disconnected from the second printed circuit board.

In an embodiment of the present invention, the area of the first printed circuit board is less than the area of the second printed circuit board.

Below, the embodiments are described in detail in cooperation with the drawings to make easily understood the technical contents, characteristics and accomplishments of the present invention.

DETAILED DESCRIPTION OF THE INVENTION

Figure 1:
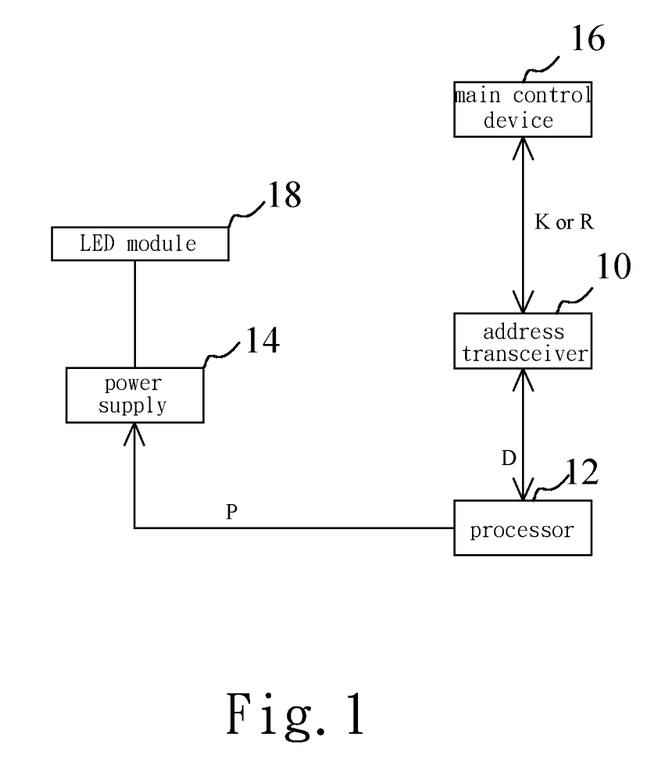
FIG. 1 is a diagram schematically showing a device for driving light-emitting diodes (LEDs) according to the first embodiment of the present invention.

Refer to FIG. 1. The first embodiment of the device for driving light-emitting diodes (LEDs) of the present invention is introduced as follows. The first embodiment of the device for driving light-emitting diodes (LEDs) comprises an address transceiver 10, a processor 12, and at least one power supply 14. The address transceiver 10 is electrically connected to a main control device 16. The power supply 14 is electrically connected to at least one light-emitting diode (LED) module 18. The address transceiver 10 stores a communication address. The main control device 16 a Konnex (KNX) protocol signal K carrying a driving address. The address transceiver 10 receives the KNX protocol signal K. The address transceiver 10 generates a driving signal D when the driving address corresponds to the communication address. The processor 12, electrically connected to the address transceiver 10, receives the driving signal D and generates a power starting signal P according to the driving signal D. The power starting signal P may be an analog signal or a pulse width modulation signal. In the first embodiment, the number of each of the power supply 14 and the LED module 18 is one. The power supply 14, electrically connected to the processor 12 and the LED module 18, receives the power starting signal P and uses the power starting signal P to drive the LED module 18. As a result, the present invention directly uses the KNX protocol signal to drive the LED module 18 rather than converts the KNX protocol signal into another protocol, such as a digital addressable lighting interface (DALI) protocol, to drive the LED module 18, thereby reducing the cost of controlling and managing illuminators. Besides, the processor 12 triggers the address transceiver 10 to generate a responding signal R carrying the communication address and transmit the responding signal R to the main control device 16, so as to notify the main control device 16 that something is wrong with the processor 12 when the processor 12 stops generating the power starting signal P.

Figure 2:
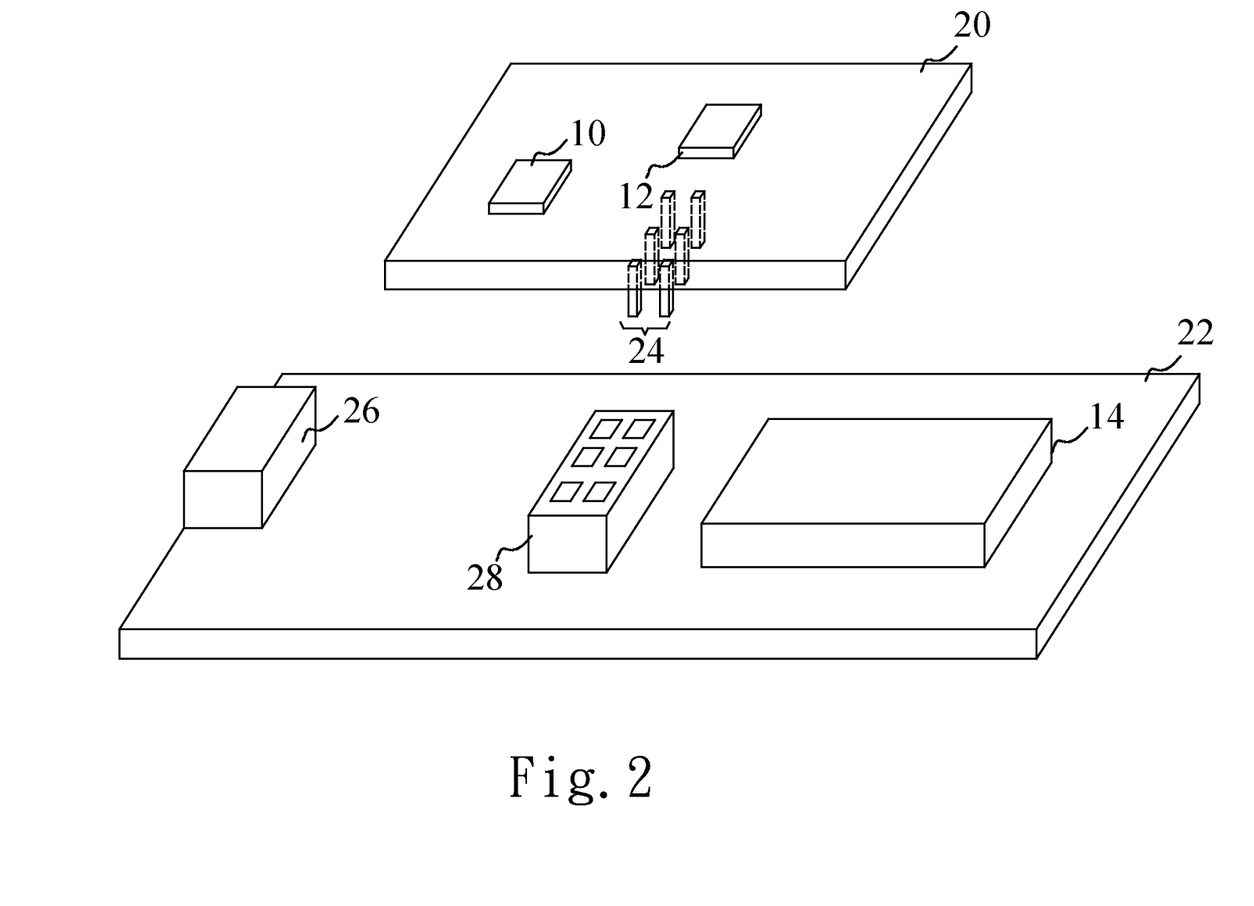
FIG. 2 is an exploded view of a device for driving light-emitting diodes (LEDs) according to the second embodiment of the present invention.

The present invention integrates the address transceiver 10, the processor 12, and the power supply 14. As a result, the present invention directly uses the KNX protocol signal K to drive the LED module 18 without connecting to any protocol converter, thereby reducing the cost of installing converters when using the device for driving LEDs of the present invention. Refer to FIG. 1 and FIG. 2. The second embodiment of the device for driving LEDs of the present invention is introduced as follows. The second embodiment is different from the first embodiment in that the second embodiment further comprises a first printed circuit board 20 and a second printed circuit board 22. The first printed circuit board 20 has two opposite surfaces. The address transceiver 10 and the processor 12 are installed on one of the two opposite surfaces of the first printed circuit board 20, another of the two opposite surfaces is provided with a first port 24, and the address transceiver 10 is electrically connected to the processor 12 through the first printed circuit board 20. The second printed circuit board 22 is provided with the power supply 14, a Konnex (KNX) protocol port 26, and a second port 28 thereon. Since the elements of the power supply 14 have larger volumes, the area of the first printed circuit board 20 is less than the area of the second printed circuit board 22, such that the KNX protocol port 26 is installed on the second printed circuit board 22, not the first printed circuit board 20. This way, the KNX protocol port 26 needs not to be replaced to avoid wasting the cost of elements if the address transceiver 10 and the processor 12 are broken. In order to conveniently receive the KNX protocol signal K and reducing the area that device for driving LEDs is occupied, the KNX protocol port 26 is close to the edge of the second printed circuit board 22, and the second port 28 is far away from the edge of the second printed circuit board 22. The first port 24 is electrically connected to the second port 28 and electrically connected to the KNX protocol port 26 and the address transceiver 10 through the first printed circuit board 20 and the second printed circuit board 22. The power supply 14 is electrically connected to the processor 12 through the first printed circuit board 20, the second printed circuit board 22, the first port 24, and the second port 28. The KNX protocol port 26 is disconnected from the second printed circuit board 22. The operation of the second embodiment is the same to that of the first embodiment so will not be reiterated.

Figure 3:
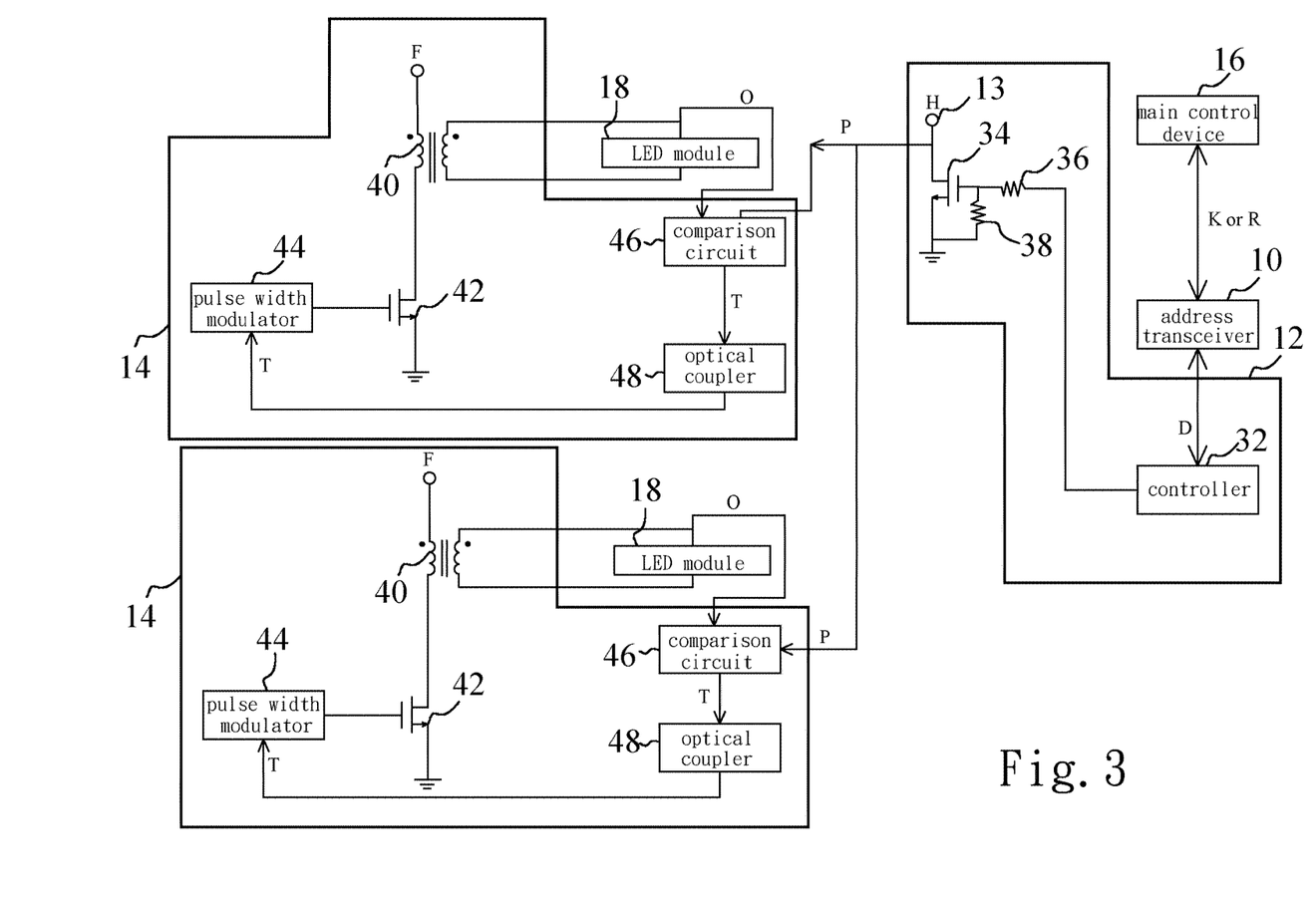
FIG. 3 is a diagram schematically showing a device for driving light-emitting diodes (LEDs) according to the third embodiment of the present invention.

Refer to FIG. 3. The third embodiment of the device for driving LEDs of the present invention is introduced as follows. The third embodiment is different from the first embodiment in the internal components of the processor 12 and the power supply 14. Besides, in the third embodiment, the power starting signal P is a pulse width modulation signal, there are a plurality of power supplies 14 and a plurality of LED modules 18, and the plurality of power supplies 14 are respectively electrically connected to the plurality of LED modules 18.

The processor 12 is electrically connected to a grounding terminal and a signal controlling terminal 13. The signal controlling terminal 13 is electrically connected to the plurality of power supplies 14. The processor 12 receives a grounding voltage through the grounding terminal, receives a high voltage H through the signal controlling terminal 13, and generates the power starting signal P at the signal controlling terminal 13 according to the driving signal D, the grounding voltage, and the high voltage H. The processor 12 further comprises a controller 32, an electronic switch 34, a first resistor 36, and a second resistor 38. The controller 32, electrically connected the address transceiver 10, receives the driving signal D. The electronic switch 34, electrically connected between the signal controlling terminal 13 and the grounding terminal, receives the grounding voltage and the high voltage H. The control terminal of the electronic switch 34 is electrically connected to the controller 32. The controller 32 cooperates with the high voltage H and the grounding voltage to use the driving signal D to control the switching state of the electronic switch 34, thereby generating the power starting signal P at the signal controlling terminal 13. The controller 32 triggers the address transceiver 10 to generate the responding signal R when the controller 32 stops controlling the switching state of the electronic switch 34. Specifically, the electronic switch 34 is an N-channel metal oxide semiconductor field effect transistor (NMOSFET), the gate of the NMOSFET is used as the control terminal, the source of the NMOSFET is electrically connected the grounding terminal, and the drain of the NMOSFET is electrically connected to the signal controlling terminal 13. The first resistor 36 is electrically connected between the controller 32 and the gate of the NMOSFET. The second resistor 38 is electrically connected between the gate and the source of the NMOSFET.

Each of the plurality of power supplies 14 further comprises a transformer 40, an electronic control switch 42, a pulse width modulator 44, a comparison circuit 46, and an optical coupler 48. The transformer 40 has a primary side and a secondary side, the primary side receives a fixed voltage F, and the secondary side is electrically connected to the corresponding LED module 18. The electronic control switch 42 is electrically connected to the primary side of the transformer 40 and the grounding terminal. The pulse width modulator 44, electrically connected to the electronic control switch 42, controls the switching state of the electronic control switch 42 and uses the fixed voltage F to store energy into the primary side of the transformer 40, and the secondary side of the transformer 40 converts the energy into an output signal O. The output signal O may be an output current or an output voltage. The comparison circuit 46, electrically connected to the secondary side of the transformer 40 and the signal controlling terminal 13, receives the output signal O and the power starting signal P and compares the output signal O with the power starting signal P to generate a comparison result T. If the output signal O is an output current, the comparison circuit 46 uses a resistor to convert the output signal O into a corresponding voltage and compares the corresponding voltage with the power starting signal P to generate the comparison result T. The optical coupler 48 is electrically connected to the comparison circuit 46 and the pulse width modulator 44. The pulse width modulator 44 receives the comparison result T through the optical coupler 48 and changes the output signal O according to the comparison result T, thereby using the output signal O to drive the corresponding LED module 18 and adjust the brightness of the corresponding LED module 18. The address transceiver 10 and the processor 12 of the present invention directly use the KNX protocol signal to drive the LED module 18 rather than convert the KNX protocol signal into another protocol, such as a digital addressable lighting interface (DALI) protocol, to drive the LED module 18, thereby reducing the cost of controlling and managing illuminators.

The operation of the third embodiment of the device for driving LEDs of the present invention is introduced as follows. Firstly, the address transceiver 10 receives the KNX protocol signal K. When the driving address corresponds to the communication address, the address transceiver 10 generates the driving signal D. The controller 32 receives the driving signal D and cooperates with the high voltage H and the grounding voltage to use the driving signal D to control the switching state of the electronic switch 34, thereby generating the power starting signal P at the signal controlling terminal 13. Simultaneously, the primary side of the transformer 40 receives the fixed voltage F, and the pulse width modulator 44 controls the switching state of the electronic control switch 42 and uses the fixed voltage F to store energy into the primary side of the transformer 40. Then, the secondary side of the transformer 40 converts the energy into the output signal O. Afterwards, the comparison circuit 46 receives the output signal O and the power starting signal P and compares the output signal O with the power starting signal P to generate the comparison result T. The comparison circuit 46 transmits the comparison result T to the pulse width modulator 44 through the optical coupler 48. The pulse width modulator 44 changes the output signal O according to the comparison result T, thereby using the output signal O to drive the corresponding LED module 18 and adjust the brightness of the corresponding LED module 18.

Figure 4:
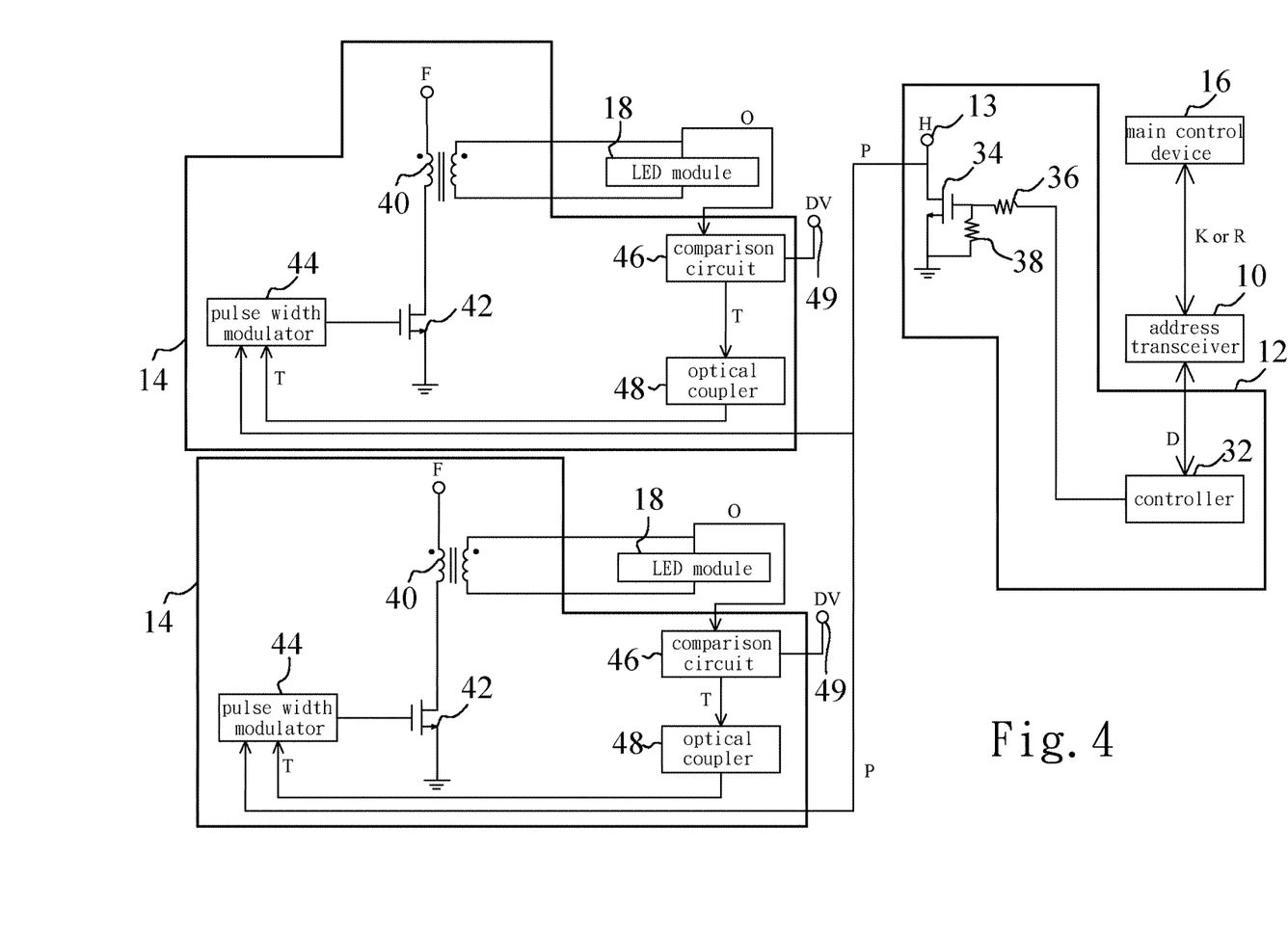
FIG. 4 is a diagram schematically showing a device for driving light-emitting diodes (LEDs) according to the fourth embodiment of the present invention.

Refer to FIG. 4. The fourth embodiment of the device for driving LEDs of the present invention is introduced as follows. The fourth embodiment is different from the third embodiment in the internal components of the power supply 14. In the fourth embodiment, the signal controlling terminal 13 is electrically connected to the pulse width modulator 44. The pulse width modulator 44 receives the power starting signal P, controls the switching state of the electronic control switch 42 according to the power starting signal P, and uses the fixed voltage F to store energy into the primary side, and the secondary side converts the energy into an output signal O. In addition, the comparison circuit 46 is electrically connected to a direct-current (DC) signal terminal 49 rather than the signal controlling terminal. The comparison circuit 46 receives the output signal O and the DC signal DV of the DC signal terminal 49 and compares the output signal O with the DC signal DV to generate a comparison result T. The other technical features of the fourth embodiment are the same to those of the third embodiment so will not be reiterated.

Figure 5:
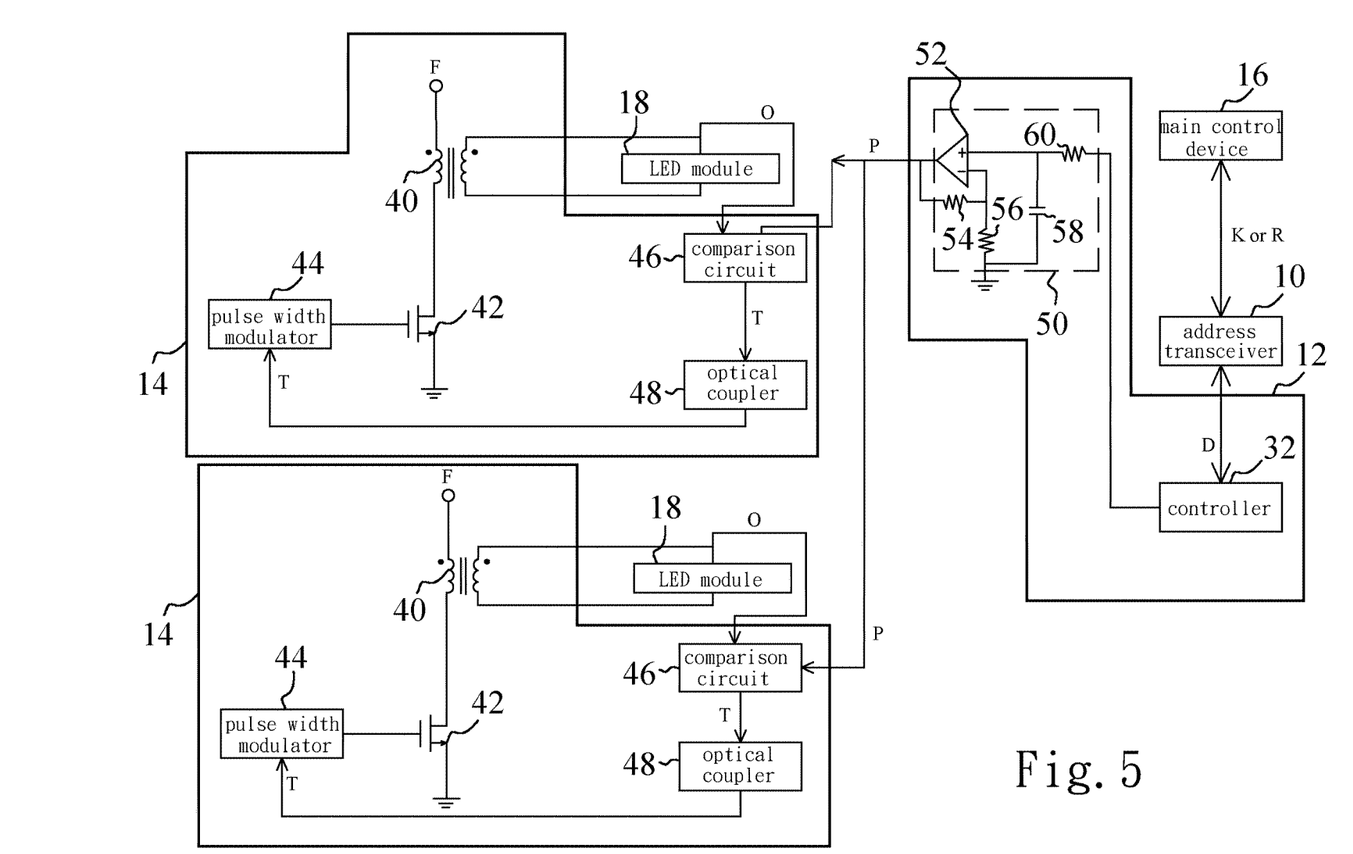
FIG. 5 is a diagram schematically showing a device for driving light-emitting diodes (LEDs) according to the fifth embodiment of the present invention.

Refer to FIG. 5. The fifth embodiment of the device for driving LEDs of the present invention is introduced as follows. The fifth embodiment is different from the first embodiment in the internal components of the processor 12 and the power supply 14. In the fifth embodiment, the power starting signal P is an analog signal, there are a plurality of power supplies 14 and a plurality of LED modules 18, and the plurality of power supplies 14 are respectively electrically connected to the plurality of LED modules 18.

The processor 12 is electrically connected to a grounding terminal and at least one power supply 14. In the fifth embodiment, there are a plurality of power supplies 14. The processor 12 receives a grounding voltage through the grounding terminal and generates a power starting signal P according to the driving signal D and the grounding voltage. The processor 12 further comprises a controller 32 and a power starter 50. The controller 32, electrically connected to the address transceiver 10 and the power starter 34, receives the driving signal D. The power starter 50, electrically connected to the plurality of power supplies 14 and the grounding terminal, receives the grounding voltage. The controller 32 cooperates with the grounding voltage to drive the power starter 50 to generate the power starting signal P. The plurality of power supplies 14 receive the power starting signal P and respectively drive the plurality of LED modules 18 according to the power starting signal P. The controller 32 triggers the address transceiver 10 to generate the responding signal R when the controller 32 stops driving the power starter 50 to generate the power starting signal P.

The power starter 50 further comprises an amplifier 52, a first starting resistor 54, a second starting resistor 56, a starting capacitor 58, and a third starting resistor 60. The amplifier 52 has a negative input, a positive input, and an output, wherein the output is electrically connected to the plurality of power supplies 14. The first starting resistor 54 is electrically connected between the output and the negative input of the amplifier 52. The second starting resistor 56 is electrically connected between the negative input of the amplifier 52 and the grounding terminal. The amplifier 52 receives the grounding voltage through the second starting resistor 56. The starting capacitor 58 is electrically connected between the grounding terminal and the positive input of the amplifier 52.

The third starting resistor 60 is electrically connected between the positive input of the amplifier 52 and the controller 32. The controller 32 uses the first starting resistor 54, the second starting resistor 56, the starting capacitor 58, the third starting resistor 60, and the grounding voltage to drive the output of the amplifier 52 to generate the power starting signal P. The controller 32 triggers the address transceiver 10 to generate the responding signal R when the controller 32 stops driving the amplifier 52 to generate the power starting signal P.

Each of the plurality of power supplies 14 further comprises a transformer 40, an electronic control switch 42, a pulse width modulator 44, a comparison circuit 46, and an optical coupler 48. The transformer 40 has a primary side and a secondary side, the primary side receives a fixed voltage F, and the secondary side is electrically connected to the corresponding LED module 18. The electronic control switch 42 is electrically connected to the primary side of the transformer 40 and the grounding terminal. The pulse width modulator 44, electrically connected to the electronic control switch 42, controls the switching state of the electronic control switch 42 and uses the fixed voltage F to store energy into the primary side of the transformer 40, and the secondary side converts the energy into an output signal O. The output signal O may be an output current or an output voltage. The comparison circuit 46, electrically connected to the secondary side of the transformer 40 and the power starter 50, receives the output signal O and the power starting signal P and compares the output signal O with the power starting signal P to generate a comparison result T. If the output signal O is an output current, the comparison circuit 46 uses a resistor to convert the output signal O into a corresponding voltage and compares the corresponding voltage with the power starting signal P to generate the comparison result T. The optical coupler 48 is electrically connected to the comparison circuit 46 and the pulse width modulator 44. The pulse width modulator 44 receives the comparison result T through the optical coupler 48 and changes the output signal O according to the comparison result T, thereby using the output signal O to drive the corresponding LED module 18 and adjust the brightness of the corresponding LED module 18. Like the third embodiment, the fifth embodiment also achieves the same purpose.

Figure 6:
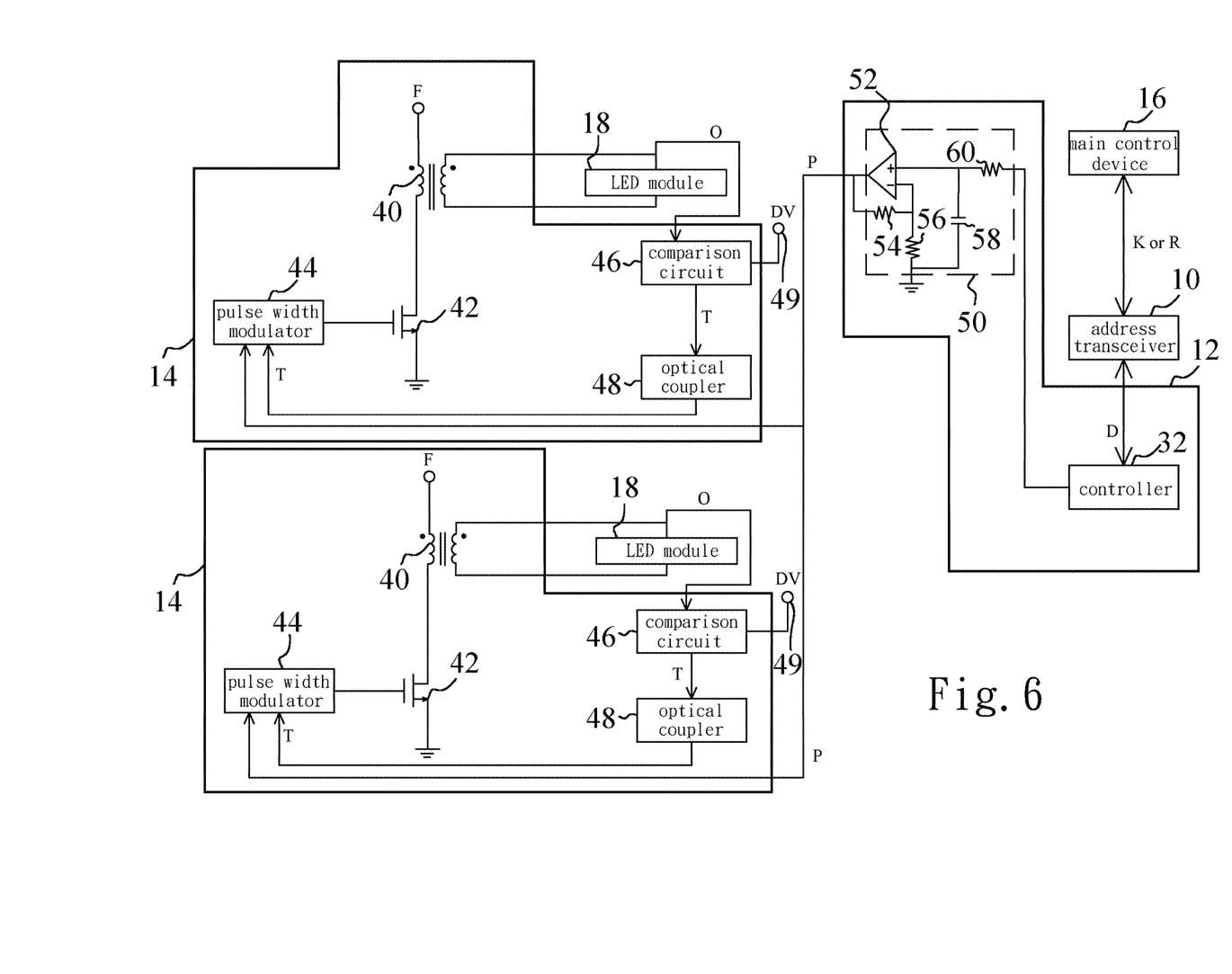
FIG. 6 is a diagram schematically showing a device for driving light-emitting diodes (LEDs) according to the sixth embodiment of the present invention.

Refer to FIG. 6. The sixth embodiment of the device for driving LEDs of the present invention is introduced as follows. The sixth embodiment is different from the fifth embodiment in the internal components of the power supply 14. In the sixth embodiment, the output of the amplifier 52 of the power starter 50 is not electrically connected to the comparison circuit 46. The output of the amplifier 52 of the power starter 50 is electrically connected to the pulse width modulator 44. The pulse width modulator 44 receives the power starting signal P, controls the switching state of the electronic control switch 42 according to the power starting signal P, and uses the fixed voltage F to store energy into the primary side of the transformer 40, and the secondary side converts the energy into an output signal O. Besides, the comparison circuit 46 is further electrically connected to a DC signal terminal 49. The comparison circuit 46 receives the output signal O and the DC signal DV of the DC signal terminal 49 and compares the output signal O with the DC signal DV to generate a comparison result T. The other technical features of the sixth embodiment are the same to those of the fifth embodiment so will not be reiterated.

In conclusion, the present invention directly uses the KNX protocol signal to drive the LED module rather than converts the KNX protocol signal into another protocol, such as a digital addressable lighting interface (DALI) protocol, to drive the LED module, thereby reducing the cost of controlling and managing illuminators.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A device for driving light-emitting diodes (LEDs) comprising:
    an address transceiver storing a communication address and receiving a Konnex (KNX) protocol signal carrying a driving address, and the address transceiver generates a driving signal when the driving address corresponds to the communication address;
    a processor, electrically connected to the address transceiver, receiving the driving signal and generating a power starting signal according to the driving signal; and
    at least one power supply, electrically connected to the processor and at least one light-emitting diode (LED) module, receiving the power starting signal and using the power starting signal to drive the at least one LED module, the KNX protocol signal is generated by a main control device electrically connected to the address transceiver, and the processor triggers the address transceiver to generate a responding signal carrying the communication address and transmit the responding signal to the main control device when the processor stops generating the power starting signal.

2. The device for driving LEDs according to claim 1, wherein the power starting signal is a pulse width modulation signal, the processor is electrically connected to a grounding terminal and a signal controlling terminal, the signal controlling terminal is electrically connected to the at least one power supply, and the processor receives a grounding voltage through the grounding terminal, receives a high voltage through the signal controlling terminal, and generates the power starting signal at the signal controlling terminal according to the driving signal, the grounding voltage, and the high voltage.

3. The device for driving LEDs according to claim 2, wherein the processor further comprises:
   a controller, electrically connected the address transceiver, receiving the driving signal; and
   an electronic switch, electrically connected between the signal controlling terminal and the grounding terminal, receiving the grounding voltage and the high voltage, a control terminal of the electronic switch is electrically connected to the controller, the controller cooperates with the high voltage and the grounding voltage to use the driving signal to control a switching state of the electronic switch, thereby generating the power starting signal at the signal controlling terminal, and the controller triggers the address transceiver to generate the responding signal when the controller stops controlling the switching state of the electronic switch.

4. The device for driving LEDs according to claim 3, wherein the electronic switch is an N-channel metal oxide semiconductor field effect transistor (NMOSFET), a gate of the NMOSFET is used as the control terminal, a source of the NMOSFET is electrically connected the grounding terminal, and a drain of the NMOSFET is electrically connected to the signal controlling terminal.

5. The device for driving LEDs according to claim 4, wherein the processor further comprises:
   a first resistor electrically connected between the controller and the gate; and
   a second resistor electrically connected between the gate and the source.

6. The device for driving LEDs according to claim 1, wherein the at least one power supply further comprises a plurality of power supplies, the at least one LED module further comprises a plurality of LED modules, and the plurality of power supplies are respectively electrically connected to the plurality of LED modules.

7. The device for driving LEDs according to claim 2, wherein the at least one power supply further comprises:
   a transformer having a primary side and a secondary side, the primary side receives a fixed voltage, and the secondary side is electrically connected to the at least one LED module;
   an electronic control switch electrically connected to the primary side and the grounding terminal;
   a pulse width modulator, electrically connected to the electronic control switch, controlling a switching state of the electronic control switch and using the fixed voltage to store energy into the primary side, and the secondary side converts the energy into an output signal;
   a comparison circuit, electrically connected to the secondary side and the signal controlling terminal, receiving the output signal and the power starting signal and comparing the output signal with the power starting signal to generate a comparison result; and
   an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

8. The device for driving LEDs according to claim 2, wherein the at least one power supply further comprises:
   a transformer having a primary side and a secondary side, the primary side receives a fixed voltage, and the secondary side is electrically connected to the at least one LED module;
   an electronic control switch electrically connected to the primary side and the grounding terminal;
   a pulse width modulator, electrically connected to the electronic control switch and the signal controlling terminal, receiving the power starting signal, controlling a switching state of the electronic control switch according to the power starting signal, and using the fixed voltage to store energy into the primary side, and the secondary side converts the energy into an output signal;
   a comparison circuit, electrically connected to the secondary side and a direct-current (DC) signal terminal, receiving the output signal and a DC signal of the DC signal terminal and comparing the output signal with the DC signal to generate a comparison result; and
   an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

9. The device for driving LEDs according to claim 1, wherein the power starting signal is an analog signal, the processor is electrically connected to a grounding terminal and the at least one power supply, and the processor receives a grounding voltage through the grounding terminal and generates the power starting signal according to the driving signal and the grounding voltage.

10. The device for driving LEDs according to claim 9, wherein the processor further comprises:
    a controller, electrically connected to the address transceiver, receiving the driving signal; and
    a power starter, electrically connected to the controller, the grounding terminal and the at least one power supply, receiving the grounding voltage, the controller cooperates with the grounding voltage to drive the power starter to generate the power starting signal, and the controller triggers the address transceiver to generate the responding signal when the controller stops driving the power starter to generate the power starting signal.

11. The device for driving LEDs according to claim 10, wherein the power starter further comprises:
    an amplifier having a negative input, a positive input, and an output, and the output is electrically connected to the at least one power supply;
    a first starting resistor electrically connected between the output and the negative input;
    a second starting resistor electrically connected between the negative input and the grounding terminal, and the amplifier receives the grounding voltage through the second starting resistor;
    a starting capacitor electrically connected between the grounding terminal and the positive input; and
    a third starting resistor electrically connected between the positive input and the controller, the controller uses the first starting resistor, the second starting resistor, the starting capacitor, the third starting resistor, and the grounding voltage to drive the output of the amplifier to generate the power starting signal, and the controller triggers the address transceiver to generate the responding signal when the controller stops driving the amplifier to generate the power starting signal.

12. The device for driving LEDs according to claim 10, wherein the at least one power supply further comprises:
a transformer having a primary side and a secondary side, the primary side receives a fixed voltage, and the secondary side is electrically connected to the at least one LED module;
an electronic control switch electrically connected to the primary side and the grounding terminal;
a pulse width modulator, electrically connected to the electronic control switch, controlling a switching state of the electronic control switch and using the fixed voltage to store energy into the primary side, and the secondary side converts the energy into an output signal;
a comparison circuit, electrically connected to the secondary side and the power starter, receiving the output signal and the power starting signal and comparing the output signal with the power starting signal to generate a comparison result; and
an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

13. The device for driving LEDs according to claim 10, wherein the at least one power supply further comprises:
a transformer having a primary side and a secondary side, the primary side receives a fixed voltage, and the secondary side is electrically connected to the at least one LED module;
an electronic control switch electrically connected to the primary side and the grounding terminal;
a pulse width modulator, electrically connected to the electronic control switch and the power starter, receiving the power starting signal, controlling a switching state of the electronic control switch according to the power starting signal, and using the fixed voltage to store energy into the primary side, and the secondary side converts the energy into an output signal;
a comparison circuit, electrically connected to the secondary side and a DC signal terminal, receiving the output signal and a DC signal of the DC signal terminal and comparing the output signal with the DC signal to generate a comparison result; and
an optical coupler electrically connected to the comparison circuit and the pulse width modulator, the pulse width modulator receives the comparison result through the optical coupler and changes the output signal according to the comparison result, thereby using the output signal to drive the at least one LED module and adjust brightness of the at least one LED module.

14. The device for driving LEDs according to claim 1, further comprising:
a first printed circuit board having two opposite surfaces, the address transceiver and the processor are installed on one of the two opposite surfaces, another of the two opposite surfaces is provided with a first port, and the address transceiver is electrically connected to the processor through the first printed circuit board; and
a second printed circuit board provided with the at least one power supply, a Konnex (KNX) protocol port, and a second port thereon, the KNX protocol port is close to an edge of the second printed circuit board, the second port is far away from the edge of the second printed circuit board, the first port is electrically connected to the second port and electrically connected to the KNX protocol port and the address transceiver through the first printed circuit board and the second printed circuit board, the at least one power supply is electrically connected to the processor through the first printed circuit board, the second printed circuit board, the first port, and the second port, and the KNX protocol port is disconnected from the second printed circuit board.

15. The device for driving LEDs according to claim 14, wherein an area of the first printed circuit board is less than an area of the second printed circuit board.

* * * * *